(12) United States Patent
Lin et al.

(10) Patent No.: US 6,531,776 B2
(45) Date of Patent: Mar. 11, 2003

(54) SEMICONDUCTOR DEVICE HAVING REDUCED INTERCONNECT-LINE PARASITIC CAPACITANCE

(75) Inventors: Ben Min-Jer Lin, Hsinchu (TW); Sheng-Jen Wang, Hsinchu (TW)

(73) Assignee: Powerchip Semiconductor Corp., Hsin-Chu (TW)

( * ) Notice: Subject to any disclaimer, the term of this patent is extended or adjusted under 35 U.S.C. 154(b) by 0 days.

(21) Appl. No.: 09/940,852

(22) Filed: Aug. 29, 2001

(65) Prior Publication Data

US 2002/0132466 A1 Sep. 19, 2002

(30) Foreign Application Priority Data

Mar. 15, 2001 (TW) .................................. 90106123 A

(51) Int. Cl.<sup>7</sup> ............................................... H01L 29/40
(52) U.S. Cl. ...................... 257/751; 257/750; 257/752; 257/758
(58) Field of Search ................................. 257/751, 750, 257/752, 758; 438/627, 643, 653, 927

(56) References Cited

U.S. PATENT DOCUMENTS

| 6,057,226 A | * | 5/2000 | Wong | 438/623 |
|---|---|---|---|---|
| 6,333,248 B1 | * | 12/2001 | Kishimoto | 438/586 |
| 6,180,518 B1 | * | 1/2002 | Layadi et al. | 438/639 |
| 6,211,075 B1 | * | 4/2002 | Liu et al. | 438/656 |
| 6,372,670 B1 | * | 4/2002 | Maeda | 438/787 |

FOREIGN PATENT DOCUMENTS

| JP | 5-3254 | * | 1/1993 | 438/FOR 405 |
|---|---|---|---|---|
| JP | 6-37035 | * | 2/1994 | 438/FOR 350 |
| JP | 6-268077 | * | 9/1994 | 438/FOR 350 |

* cited by examiner

*Primary Examiner*—Jasmine J B Clark
(74) *Attorney, Agent, or Firm*—Rabin & Berdo, P.C.

(57) ABSTRACT

A method of forming a semiconductor device having reduced interconnect-line parasitic capacitance is provided. The method includes the following steps. First, a substrate is provided and a plurality of interconnect lines are formed on the substrate. A barrier layer is then formed. Next, the barrier layer is hardened and thinned so as to make the barrier layer having a thin-film attribute. Following that, a separation layer is formed by filling the space between and above the interconnect lines with a dielectric. Then, the dielectric is foamed. After that, an insulating layer is formed. Finally, the dielectric is condensed such that air gaps are formed in the separation layer.

9 Claims, 4 Drawing Sheets

SEMICONDUCTOR DEVICE HAVING REDUCED INTERCONNECT-LINE PARASITIC CAPACITANCE

This application incorporates by reference Taiwanese application Serial No. 90106123, filed on Mar. 15, 2001.

BACKGROUND OF THE INVENTION

1. Field of the Invention

The invention relates in general to a semiconductor device and a fabrication method, and more particularly to a semiconductor device having reduced parasitic capacitance between metal lines, and to a fabrication method thereof.

2. Description of the Related Art

During semiconductor fabrication, an integrated circuit (IC) is fabricated by interconnecting a plurality of various transistors with interconnect lines successfully. According to the signal paths of a circuit design, these interconnect lines are employed for interconnecting the transistors to become a complete circuit. Such interconnect lines as metal lines doped with silicon are the main conductors used for contacts and interconnection. Generally, metal lines include conductors such as copper (Cu), aluminum (Al), or an alloy of Al and Cu, or tungsten (conductor adopted in high temperature fabrication). In addition, a single level of metal layer cannot provide interconnection for completing integrated circuits nowadays. For the requirements of integrated circuits, two, three, or even five levels of metal layers are employed, and a multiple-level interconnect technology is used to interconnect these metal layers. Further, a good insulating material, such as silicon dioxide ($SiO_2$), is used for dielectric layers for separating these metal layers to avoid a short circuit.

Unfortunately, the separation of the metal lines by using insulating material leads to the formation of parasitic capacitance among the metal lines on a signal level of metal layer, resulting in a delay of speed of the integrated circuit. For two metal lines separated by a dielectric material, it is desired to reduce the capacitance between the two metal lines. Since the capacitance is proportional to the dielectric constant of the dielectric material and inversely proportional to the distance between the two metal lines, the capacitance is able to be reduced by using a dielectric material having a low dielectric constant or increasing the distance between the two metal lines. However, an increase of the distance between the two metal lines results in an increase of the size of the semiconductor device. Thus, dielectric materials having low dielectric constants are conventionally employed to reduce the parasitic capacitance between metal lines. For instance, referring to FIG. 1, it illustrates a cross-section view of a conventional structure of metal lines with an inter-layer dielectric. As shown in FIG. 1, the space between and above metal lines 104 formed on a substrate 102 is filled with silicon dioxide so that an inter-layer dielectric 106 is formed, where the dielectric constant of silicon dioxide is four.

Another technique for reducing the parasitic capacitance between the metal lines is described in L. D. Wong and B. Oreg, U.S. Pat. No. 6,057,226. The main principle of this technique is to form an air bridge between the metal lines by covering the metal lines with fluorinated amorphous carbon as the inter-layer dielectric. Since the metal lines are closely spaced, the filling by the fluorinated amorphous carbon is incomplete, resulting in the air bridge between the metal lines. In addition, the dielectric constant of the air is approximately equal to one so that the dielectric constant between the metal lines is reduced, thus reducing the parasitic capacitance.

Referring to FIG. 2A, it illustrates a cross-sectional view of a conventional structure of metal lines and an inter-layer dielectric. In FIG. 2A, metal lines 204 formed on a substrate 202 are covered with fluorinated amorphous carbon 206 so as to form air gaps 208 between metal lines 204. An insulating layer 210 is then formed over the fluorinated amorphous carbon 206. The disadvantage of the technique is the difficulty in controlling the flow of fluorinated amorphous carbon 206 between metal lines 204, resulting in non-uniform sizes of air gaps 208. In a worse case, only insignificant air gaps are formed. Besides, when metal lines 204 are spaced in a way such that a large amount of fluorinated amorphous carbon fills the space between metal lines 204, air gaps are much more difficult to be formed. In practice, air gaps 208 are not formed so ideally as shown in FIG. 2A.

In addition, L. D. Wong and B. Oreg provide a method to reduce the parasitic capacitance between metal lines. Referring to FIG. 2B, it illustrates a cross-sectional view of another structure of inter-layer dielectric and metal lines. Compared to the structure in FIG. 2A, the structure in FIG. 2B includes a hard-mask layer 212 and a liner 214 additionally.

As shown in FIG. 2B, hard-mask layer 212 is formed over the topsides of metal lines 204 which are formed on substrate 202. Then, liner 214 is to cover hard-mask layer 212, walls of metal lines 204, and portions of the substrate 202 between metal lines 204 so as to enhance the structure. Next, fluorinated amorphous carbon 206 fills the space between and above metal lines 204 such that air gaps 208 are formed between metal lines 204. Finally, insulating layer 210 is formed over fluorinated amorphous carbon 206. In this way, the spacing between metal lines 204 is theoretically reduced by the addition of liner 214, leading to an reduction of the amount of fluorinated amorphous carbon which fills the space between metal lines 204 during manufacturing process. Following that, air gaps 208 formed as shown in FIG. 2B are larger than that formed as shown in FIG. 2A, but it is still unable to control the flow of fluorinated amorphous carbon 206. Besides, since hard-mask layer 212 has a thickness in the range of approximately 50 nm to 100 nm and liner 214 has a thickness in the range of approximately 10 nm to 100 nm, a single level of metal layer as shown in FIG. 2B has a larger total thickness than that as shown in FIG. 2A by approximately 60 nm to 100 nm, resulting in an increase in the size of the semiconductor device. Further, the addition of the hard-mask layer increases the complexity of the manufacturing process, resulting in an increase of the manufacturing cost.

SUMMARY OF THE INVENTION

It is therefore an object of the invention to provide a semiconductor device having reduced interconnect-line parasitic capacitance. In this invention, a dielectric with a low dielectric constant and capable of being foamed is used to fill the space between metal lines formed on a substrate. The foamed dielectric is then condensed so that a lot of small pores become large pores. In this way, the dielectric constant between the metal lines is low, reducing the parasitic capacitance between metal lines effectively. Further, a manufacturing process according to the invention is provided with no such difficulty in controlling the flow of inter-layer dielectric and the size of air gaps as in the conventional manufacturing process; and a process of forming hard-mask layer becomes unnecessary. Thus, the manufacturing process is simplified, resulting in a reduction of the manufacturing cost.

The invention achieves the above-identified object by providing a semiconductor device having reduced interconnect-line parasitic capacitance. The semiconductor includes a substrate, a barrier layer, a separation layer, and an insulating layer. The substrate has a plurality of interconnect lines formed thereon. The barrier layer is deposited on the substrate, which covers the interconnect lines and the substrate. In addition, the separation layer is deposited on the space between the interconnect lines, which is formed by filling the space between the interconnect lines with a low-k dielectric. The insulating layer is deposited above the separation layer, which covers the interconnect lines and the barrier layer.

In accordance with the object of the invention, a method of forming a semiconductor device having reduced interconnect-line parasitic capacitance is provided. The method includes the following steps. First, a substrate is provided and a plurality of interconnect lines are formed on the substrate. A barrier layer is then formed. Next, the barrier layer is hardened and thinned so as to make the barrier layer having a thin-film attribute. Following that, a separation layer is formed by filling the space between and above the interconnect lines with a dielectric. Then, the dielectric is foamed. After that, an insulating layer is formed. Finally, the dielectric is condensed such that air gaps are formed in the separation layer.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Referring to FIGS. 3A–3E, they illustrate a manufacturing process of a semiconductor device according to a preferred embodiment of the invention.

Figure 1:
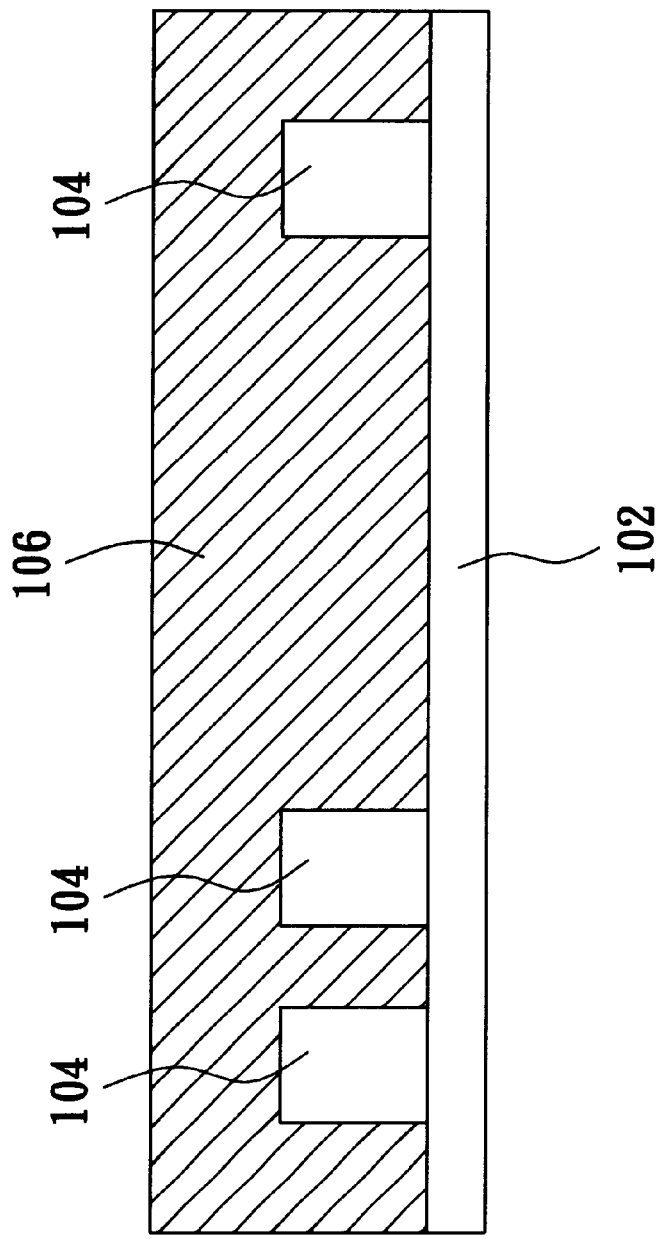
FIG. 1 (Prior Art) illustrates a cross-sectional view of a conventional structure of metal lines with an inter-layer dielectric.
Figure 2A:
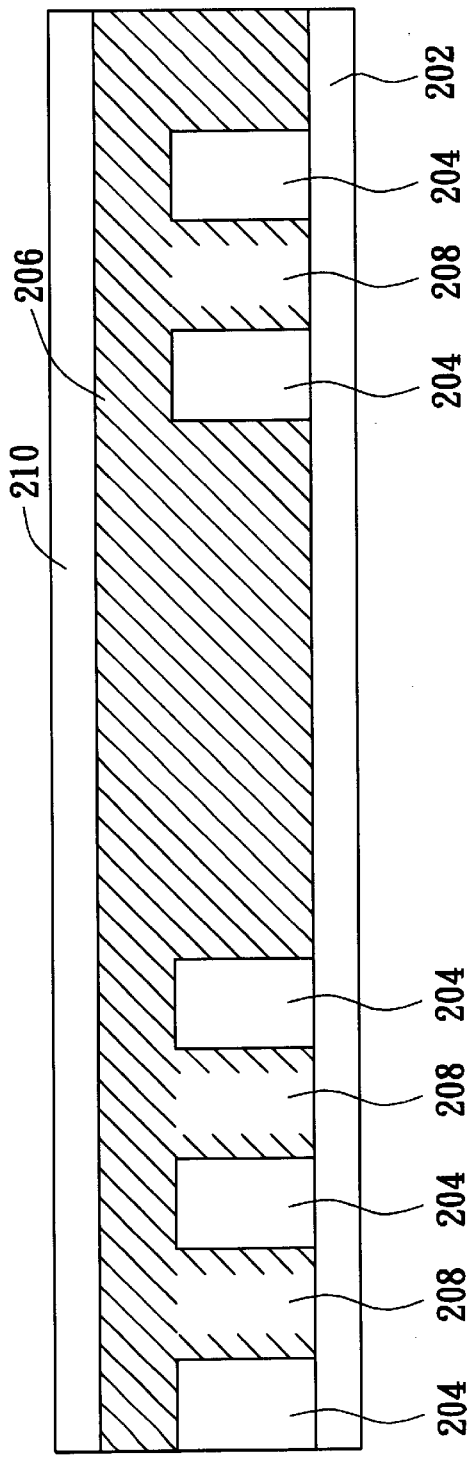
FIG. 2A (Prior Art) illustrates a cross-sectional view of another conventional structure of metal lines with an inter-layer dielectric.
Figure 2B:
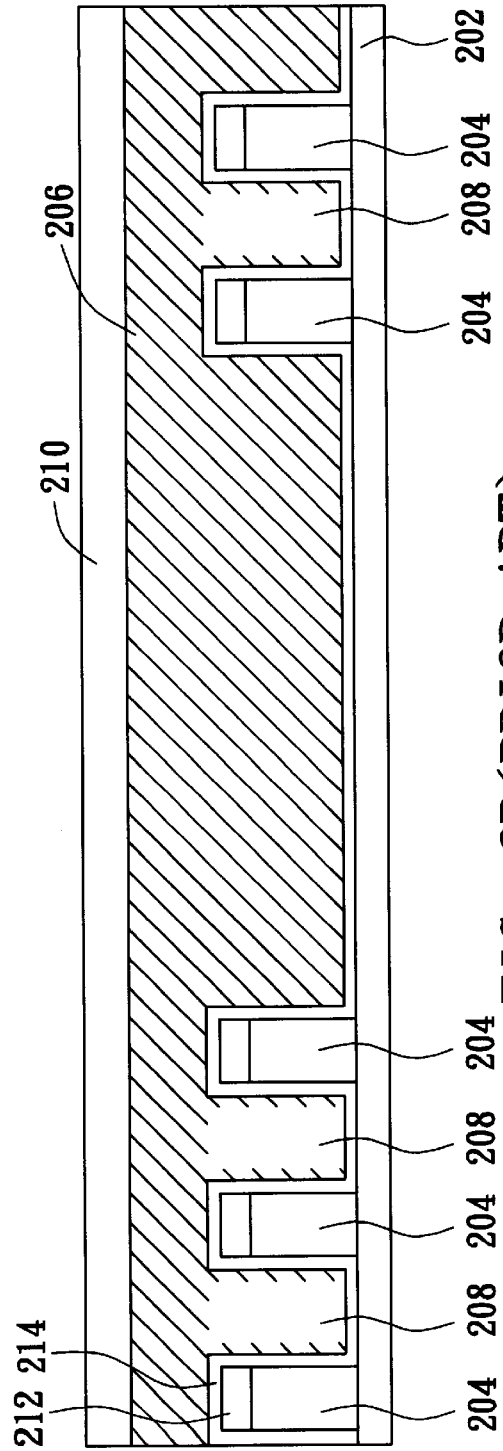
FIG. 2B (Prior Art) illustrates a cross-sectional view of another conventional structure of metal lines with an inter-layer dielectric.
Figure 3A:
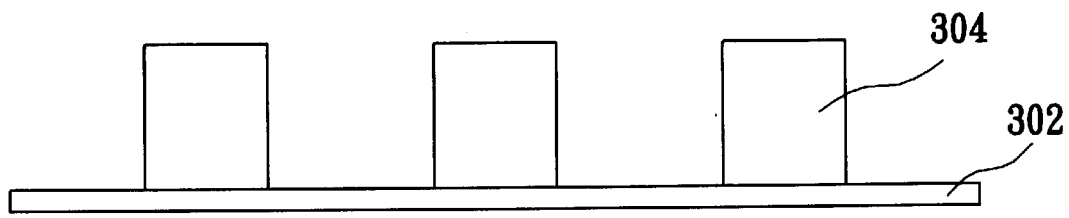
FIGS. 3A–3E illustrate a manufacturing process of a semiconductor device according to a preferred embodiment of the invention.

First, as shown in FIG. 3A, a substrate 302 is provided and a plurality of metal lines 304 are formed on substrate 302.

Figure 3B:
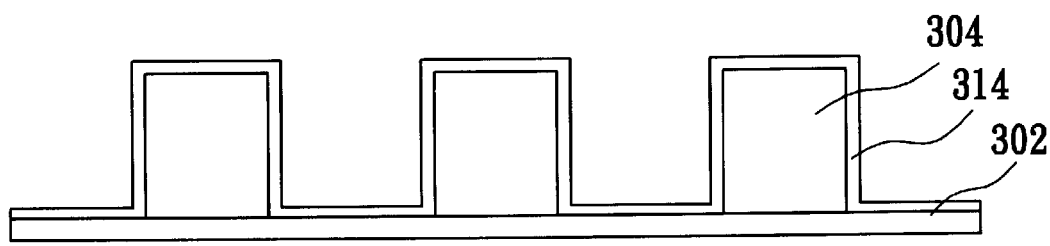

Next, a barrier layer 314 is formed as shown in FIG. 3B, where barrier layer 314 covers metal lines 304, walls of metal lines 304, and portions of substrate 302. Barrier layer 314 is then thinned and hardened by using a plasma source in high temperature, and the surface characteristic of barrier layer 314 is modified as well so that the barrier layer has a thin-film attribute. After being thinned and hardened, barrier layer 314 improves the stability of metal lines 304 on substrate 302 and protects metal lines 304 from other adverse effects during the manufacturing process of the semiconductor device. Further, after barrier layer 314 is processed by using plasma source in high temperature, the stress effect which may occur due to barrier layer 314 during the subsequent manufacturing process is reduced, thus increasing the yield.

Figure 3C:
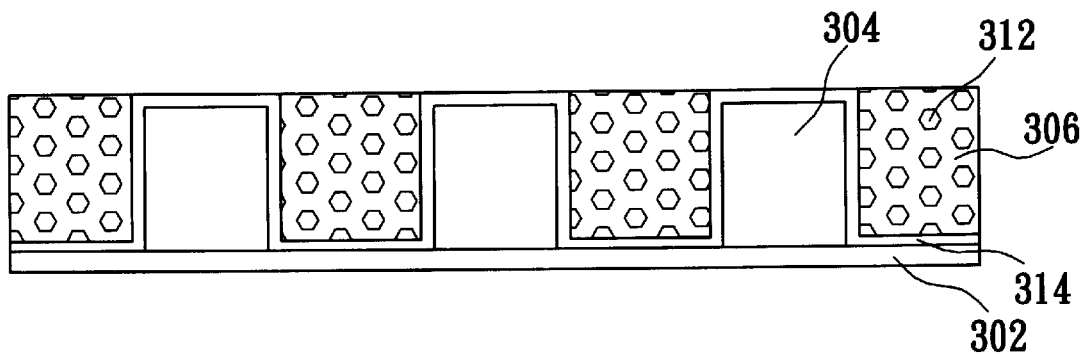

As shown in FIG. 3C, a separation layer 306 is then formed by filling the space between metal lines 304 with a low-k dielectric which is capable of being foamed. Next, the low-k dielectric of separation layer 306 is foamed through deposition, gelation, and drying processes. Consequently, a lot of pores 312 occur in separation layer 306, where the pores have sizes of 2 nm approximately.

Figure 3D:
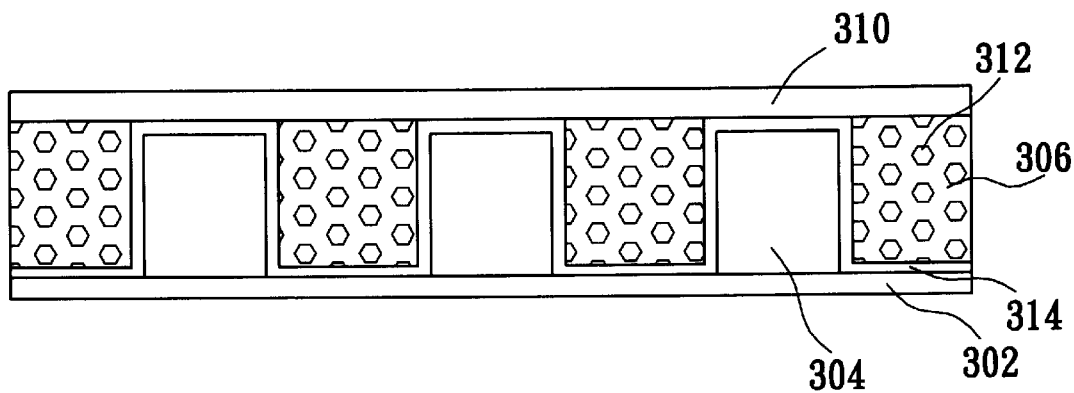

As shown in FIG. 3D, after the formation of the pores, an insulating layer 310 in the liquid state is formed by using spin-coating, where insulating layer 310 covers barrier layer 314 as well as separation layer 306 and is composed of a material such as silicon dioxide. Consequently, insulating layer 310, separation layer 306, and barrier layer 314 protect metal lines 304 from other adverse effects during the manufacturing process of the semiconductor device.

Figure 3E:
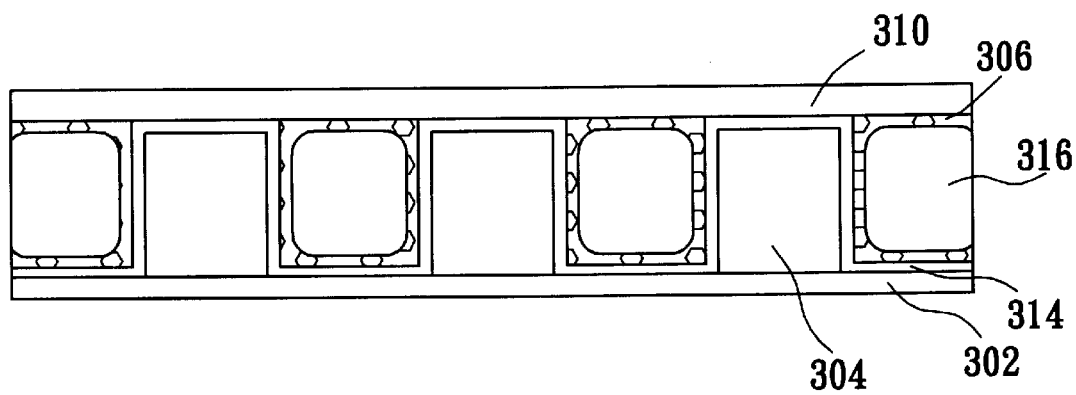

Next, insulating layer 310 in the liquid state is heated to 400 degrees C. approximately so that insulating layer 310 is cured. While insulating layer 310 is being cured, the pores in separation layer 306 condense into air gaps 316, which is much larger than pores in size, as shown in FIG. 3E. As a result of the formation of air gaps 316, the dielectric constant of the separation layer is reduced to being in the range of approximately 1.0 to 2.0.

Dielectric filling the space between metal lines 304 is a material capable of being foamed, such as a solution of organosilicon with an inorganic dielectric. For instance, the organosilicon can be compounds based on tetra-ethyl-orthosilicate (TEOS), or compounds based on tetra-methyl-orthosilicate (TMOS). The inorganic dielectric can be a material such as nanoporous metal oxide, or preferably nanoporous silica. In addition, the organosilicon is to be oxidized when it is heated to a specific temperature so that many pores occur in the separation layer, such as pores 312 occurred in separation layer 306 as shown in FIG. 3D, where the density of separation layer 306 is in the range of approximately 0.1 to 0.2 g/cm$^3$.

Through the process of curing, foamed dielectric material has its pores combine into the air gaps, such as air gaps 316 formed by pores 312 as shown in FIG. 3E. Since the dielectric constant of the air is equal to one, the formation of air gaps 316 in separation layer 306 results in a reduction of the dielectric constant of separation layer 306. In this way, the parasitic capacitance between metal lines 304 is reduced as well.

In addition, aerogel can be used as a dielectric material of the separation layer. Intrinsically, the aerogel in the solid or liquid state has gas distributed over itself in the form of pores. In this way, air gaps such as air gaps 316 shown in FIG. 3E can be obtained by condensing the aerogel. Likewise, the parasitic capacitance between the metal lines along with the dielectric material using aerogel is reduced.

As the embodiment disclosed above, it provides a semiconductor device having reduced interconnect-line parasitic capacitance. In this invention, a dielectric with a low dielectric constant and capable of being foamed is used to fill the space between metal lines formed on a substrate. The foamed dielectric is then condensed so that a lot of small pores become large pores. In this way, the dielectric constant between the metal lines is low, reducing the parasitic capacitance between metal lines effectively. Further, the manufacturing process according to the invention has no such difficulty in controlling the flow of inter-layer dielectric and the size of air gaps as in the conventional manufacturing process; so, a process of forming hard-mask layer becomes unnecessary. Thus, the manufacturing process according to the invention is simplified, resulting in a reduction of the manufacturing cost.

While the invention has been described by way of example and in terms of the preferred embodiment, it is to be understood that the invention is not limited to the disclosed embodiment. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device comprising:
   a substrate;
   a plurality of interconnect lines formed on the substrate;
   a barrier layer deposited on the substrate and the interconnect lines;
   a separation layer provided in spaces between the interconnect lines, wherein the separation layer is produced with a foaming process and contains a plurality of pores; and
   an insulating layer deposited on the separation layer, which covers the interconnect lines and the barrier layer.

2. The semiconductor device according to claim 1, wherein the device further comprises an oxide layer disposed between the substrate and interconnect lines.

3. The semiconductor device according to claim 1, wherein the separation layer is a dielectric material composed of aerogel.

4. The semiconductor device according to claim 1, wherein the separation layer is composed of organosilicon and inorganic dielectric.

5. The semiconductor device according to claim 1, wherein the plurality of pores inside the separation layer can be cured to form air gaps.

6. The semiconductor device according to claim 4, wherein the organosilicon is tetra-ethyl-ortho-silicate (TEOS).

7. The semiconductor device according to claim 4, wherein the organosilicon is tetra-methyl-ortho-silicate (TMOS).

8. The semiconductor device according to claim 4, wherein the inorganic dielectric is nanoporous metal oxide.

9. The semiconductor device according to claim 4, wherein the inorganic dielectric is nanoporous silica.

* * * * *